(12) United States Patent
Yun et al.

(10) Patent No.: US 9,515,280 B2
(45) Date of Patent: Dec. 6, 2016

(54) ORGANIC LIGHT EMITTING DEVICE WITH ENHANCED LIFESPAN

(71) Applicant: SAMSUNG DISPLAY CO., LTD., Yongin-si, Gyeonggi-do (KR)

(72) Inventors: Jin-Young Yun, Yongin-si (KR); Chang-Ho Lee, Suwon-si (KR); Dae-Yup Shin, Yongin-si (KR); Young-Mok Son, Yongin-si (KR); Il-Soo Oh, Yongin-si (KR); Hee-Joo Ko, Yongin-si (KR); Se-Jin Cho, Yongin-si (KR); Bo-Ra Lee, Yongin-si (KR); Yeon-Woo Lee, Yongin-si (KR); Beom-Joon Kim, Yongin-si (KR); Jung-Geun Lee, Yongin-si (KR); Young-Woo Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 620 days.

(21) Appl. No.: 13/624,800

(22) Filed: Sep. 21, 2012

(65) Prior Publication Data

US 2013/0161590 A1    Jun. 27, 2013

(30) Foreign Application Priority Data

Dec. 26, 2011    (KR) .................. 10-2011-0142014

(51) Int. Cl.
*H01L 51/54* (2006.01)
*H01L 51/50* (2006.01)
*H01L 51/00* (2006.01)

(52) U.S. Cl.
CPC ....... *H01L 51/5024* (2013.01); *H01L 51/0085* (2013.01); *H01L 51/5004* (2013.01);
(Continued)

(58) Field of Classification Search
CPC .......... H01L 51/5024; H01L 2251/552; H01L 2251/5384; H01L 51/5004; H01L 51/5088; H01L 51/5016; H01L 51/5072; H01L 51/0085; H01L 51/008; H01L 51/00857; H01L 51/5052
(Continued)

(56) References Cited

U.S. PATENT DOCUMENTS

| 7,931,975 B2 * | 4/2011 | Begley et al. ................. 428/690 |
| 8,088,500 B2 * | 1/2012 | Begley ................... C09K 11/06 313/504 |

(Continued)

FOREIGN PATENT DOCUMENTS

| CN | 101020818 A | 8/2007 |
| CN | 101123298 A | 2/2008 |

(Continued)

OTHER PUBLICATIONS

JPO Office action dated Oct. 29, 2013, for corresponding Japanese Patent application 2012-280042, (2 pages).
(Continued)

*Primary Examiner* — Thinh T Nguyen
(74) *Attorney, Agent, or Firm* — Lewis Roca Rothgerber Christie LLP (57) ABSTRACT

An organic light emitting device, and a manufacturing method of the same, in which in a light emitting layer, an electron trap material is introduced so as to improve a light emitting property and an operating characteristic and to prolong a life span.

11 Claims, 3 Drawing Sheets

(52) U.S. Cl.
CPC ...... *H01L 51/5016* (2013.01); *H01L 51/5072* (2013.01); *H01L 2251/5384* (2013.01); *H01L 2251/552* (2013.01)

(58) Field of Classification Search
USPC ............................ 257/40, 80, 642, E39.007, E51.018,257/E21.026; 438/22, 24, 46
See application file for complete search history.

(56) References Cited

U.S. PATENT DOCUMENTS

| | | | |
|---|---|---|---|
| 8,102,116 B2* | 1/2012 | Kamatani | C07C 13/62 313/504 |
| 8,324,800 B2* | 12/2012 | Royster et al. | 313/504 |
| 2007/0278938 A1* | 12/2007 | Yabunouchi | C07D 307/91 313/504 |
| 2008/0074038 A1 | 3/2008 | Kim et al. | |
| 2008/0268285 A1* | 10/2008 | Okinaka | H01L 51/0054 428/691 |
| 2009/0015140 A1 | 1/2009 | Kawakami et al. | |
| 2009/0191427 A1 | 7/2009 | Liao et al. | |
| 2009/0206741 A1 | 8/2009 | Yoon et al. | |
| 2009/0309487 A1* | 12/2009 | Royster et al. | 313/504 |
| 2010/0117520 A1* | 5/2010 | Begley | C09K 11/06 313/504 |
| 2010/0157131 A1* | 6/2010 | Kamatani | C07C 13/62 348/333.11 |
| 2012/0001158 A1 | 1/2012 | Asari et al. | |
| 2012/0013244 A1 | 1/2012 | Kawamura et al. | |
| 2012/0138904 A1 | 6/2012 | Shimizu et al. | |
| 2013/0001542 A1 | 1/2013 | Okajima et al. | |

FOREIGN PATENT DOCUMENTS

| | | |
|---|---|---|
| EP | 0 643 118 A1 | 3/1995 |
| JP | 2006-287242 | 10/2006 |
| JP | 2007-039431 | 2/2007 |
| JP | 2008-294404 | 12/2008 |
| JP | 2011-216640 | 10/2011 |
| KR | 10-2007-0101516 A | 10/2007 |
| KR | 10-2008-0048977 A | 6/2008 |
| KR | 10-2009-0089635 | 8/2009 |
| KR | 10-2009-0089635 A | 8/2009 |
| KR | 10-2011-0053565 | 5/2011 |
| KR | 10-2011-0061500 A | 6/2011 |
| TW | 200725960 A | 7/2007 |
| TW | 201100518 A1 | 1/2011 |
| TW | 201129672 A | 9/2011 |
| WO | WO 2009/038171 A1 | 3/2009 |
| WO | WO 2010/098246 A1 | 9/2010 |
| WO | WO 2011/074254 A1 | 6/2011 |
| WO | WO 2012/013271 A1 | 2/2012 |

OTHER PUBLICATIONS

KIPO Office action dated Dec. 18, 2013, for Korean priority Patent application 10-2011-0142014, (6 pages).
Taiwanese Office action dated Jan. 20, 2015, with English translation, for corresponding Taiwan Patent application 101131288, (18 pages).
JPO Office action dated Mar. 4, 2014, for corresponding Japanese Patent application 2012-280042, (1 page).
Tsang et al., "Host engineering for improving the performance of blue phosphorescent organic light-emitting devices", Organic Electronics, vol. 12, (2011), pp. 1114-1119.
European Search Report mailed Mar. 20, 2013 for EP Patent Application No. 12194229.6-1555, 8 pages.
SIPO Office action dated Feb. 28, 2015, with English translation, corresponding to Chinese Patent application 201210518420.X, (26 pages).
KIPO Office action dated Jun. 10, 2013, for Korean priority Patent application 10-2011-0142014, (6 pages).
SIPO Office action dated Oct. 30, 2015, with English translation, for corresponding Chinese Patent application 201210518420.X, (30 pages).

* cited by examiner

ORGANIC LIGHT EMITTING DEVICE WITH ENHANCED LIFESPAN

CROSS-REFERENCE TO RELATED PATENT APPLICATION

This application claims priority to and the benefit of Korean Patent Application No. 10-2011-0142014, filed on Dec. 26, 2011, in the Korean Intellectual Property Office, the disclosure of which is incorporated herein in its entirety by reference.

BACKGROUND

1. Field

An aspect of the present invention relates to an organic light emitting device with enhanced life span, and a manufacturing method of the same.

2. Description of the Related Art

In a display field, an organic light emitting device has recently been spotlighted. Such an organic light emitting device uses light generated by luminescence decay through a combination of electrons and holes.

The organic light emitting device basically includes an electrode for hole injection, an electrode for electron injection, and a light emitting layer, and has a structure that a light emitting layer is interposed between the electrode (anode) for hole injection and the electrode (cathode) for electron injection. Specifically, in the organic light emitting device, electrons are injected at a cathode, and holes are injected at an anode. Then, the electrons and the holes are moved in opposite directions by an outer electric field, are combined in the light emitting layer, and emit light through luminescence decay. In such an organic light emitting device, the light emitting layer is made of a monomolecular organic material or a polymer.

Figure 1:
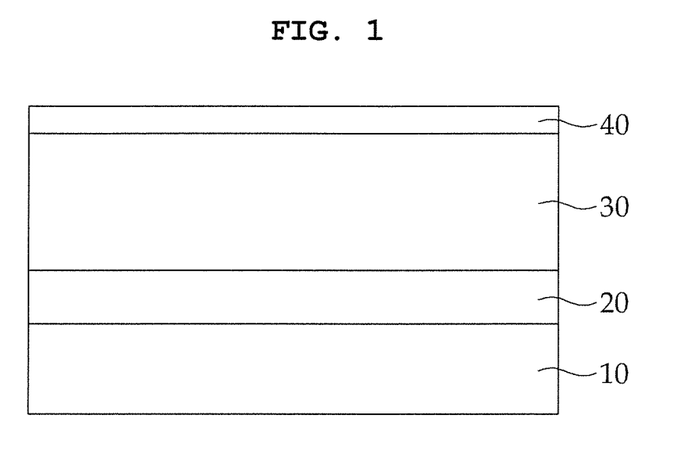
FIG. 1 is a schematic view illustrating a structure of a general organic light emitting device.

FIG. 1 is a schematic view illustrating the concept of an organic light emitting device.

Referring to FIG. 1, the organic light emitting device basically has a structure where on a substrate 10, a first electrode 20 is formed, on the first electrode 20, an organic layer 30 is disposed, and on the organic layer 30, a second electrode 40 is disposed. Herein, between the first electrode 20 and the second electrode 40, the organic layer 30 is disposed, and the organic layer 30 includes a light emitting layer in which luminescence decay occurs through a combination of holes and electrons. One of the first electrode and the second electrode is an anode for hole injection, and the other is a cathode for electron injection.

Figure 2:
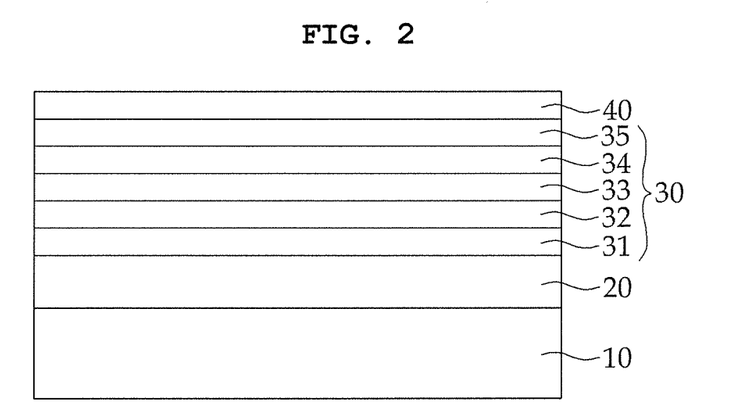
FIG. 2 is a detailed schematic view illustrating the structure of an organic layer in the organic light emitting device shown in FIG. 1.

FIG. 2 shows an example of a multi-layered structure of the organic layer 30 in the organic light emitting device. In the organic layer 30, an anode, a hole injection layer, a hole transport layer, a light emitting layer, an electron transport layer, and an electron injection layer are sequentially layered. If the first electrode 20 is an anode, and the second electrode is a cathode, a hole injection layer 31, a hole transport layer 32, a light emitting layer 33, an electron transport layer 34 and an electron injection layer 35 are sequentially layered. On the other hand, if the first electrode 20 is a cathode and the second electrode is an anode, an electron injection layer 31, an electron transport layer 32, a light emitting layer 33, a hole transport layer 34, and a hole injection layer 35 are sequentially layered. Also, in many cases, the electron injection layer is made of a metal element or a compound thereof instead of an organic material, and thus may be considered as a separate layer without being included in the organic layer.

Such an organic light emitting device includes a plurality of pixels such as red, green, and blue pixels. With various combinations of these pixels, a full range of colors can be emitted. The pixels of the organic light emitting device are made of light emitting materials, and the light emitting materials have different life spans according to their kinds. A pixel made of a material having a short light emitting life span cannot emit a color having its own original color coordinate as time goes on. This makes it difficult to emit characteristic color of its own such as red, green and blue. Furthermore, when the colors are combined to obtain other required colors, it may be impossible to emit a required color due to a pixel having a short light emitting life span.

In order to prolong the life span of a light emitting material and an organic light emitting device using the material, various structures and materials have been researched. However, there is a problem in that the improvement of the life span of the light emitting material deteriorates other properties.

Accordingly, it is required to develop a light emitting material and a device structure, which can maintain luminous efficiency and operating characteristics while improving the life span.

SUMMARY

Accordingly, considering the above-mentioned problems occurring in the prior art, an aspect of an embodiment of the present invention is directed toward an organic light emitting device which can properly maintain light emitting property and operating characteristics while prolonging life span.

An aspect of an embodiment of the present invention is directed toward improving a life span of an organic light emitting device by introducing an electron trap material into a light emitting layer. In addition, an aspect of an embodiment of the present invention is directed toward a method of manufacturing an organic light emitting device by introducing an electron trap material into a light emitting layer. Aspects of embodiments of the present invention are directed toward an organic light emitting device, and a manufacturing method of the same, in which an electron trap material is introduced in a light emitting layer and thus a life span is prolonged without a loss of a light emitting property and an operating property.

In an embodiment of the present invention, there is provided an organic light emitting device including: a substrate; a first electrode formed on the substrate; an organic light emitting layer formed on the first electrode; and a second electrode formed on the organic light emitting layer, wherein the organic light emitting layer includes a host, a dopant and an electron trap material, and the electron trap material has LUMO (Lowest Unoccupied Molecular Orbital) level and HOMO (Highest Occupied Molecular Orbital) level each lower than the LUMO level and HOMO level of the host, respectively.

In an embodiment of the present invention, at least one of a hole injection layer or a hole transport layer is disposed between the first electrode and the organic light emitting layer. In another embodiment of the present invention, at least one of an electron transport layer or an electron injection layer is disposed between the organic light emitting layer and the second electrode.

In an embodiment of the present invention, the host is a fluorescent host, that is, a fluorescent light emitting type host material.

In an embodiment of the present invention, the electron trap material has the LUMO level and HOMO level each lower than the LUMO level and HOMO level of the host by 0.1~0.5 eV, respectively. In another embodiment of the present invention, the electron trap material has the LUMO level and HOMO level each lower than the LUMO level and HOMO level of the host by 0.1~0.3 eV, respectively.

In an embodiment of the present invention, the electron trap material may be represented by Formula 1 below:

Formula 1 wherein X represents aromatic hydrocarbon, and R1, R2, R3, R4, R5, and R6 each represent H, [EW], R or R-[EW], wherein H represents hydrogen, [EW] represents an electron withdrawing group, R represents an aromatic compound, and all of R1 to R6 are not each hydrogen (H).

In an embodiment of the present invention, the organic light emitting layer may include the dopant in an amount of 1~25 parts by weight, and the electron trap material in an amount of 1~50 parts by weight, with respect to 100 parts by weight of the host.

In an embodiment of the present invention, the dopant and the electron trap material may be included in a weight ratio of 1:1~2 (dopant:electron trap material).

In an embodiment of the present invention, the electron trap material has an emission wavelength shorter than that of the dopant.

In an embodiment of the present invention, the organic light emitting layer can be formed by co-deposition of a host material, a dopant material and the electron trap material.

In an embodiment of the present invention, the dopant has LUMO level and HOMO level each higher than the LUMO level and HOMO level of the host respectively. For example, the dopant has LUMO level and HOMO level each higher than the LUMO level and HOMO level of the host by 0.1~0.5 eV, respectively.

In accordance with another embodiment of the present invention, there is provided a method for manufacturing an organic light emitting device.

The method for manufacturing an organic light emitting device includes the steps of: forming a first electrode on a substrate; forming a light emitting layer including a host, a dopant and an electron trap material on the first electrode; and forming a second electrode on the light emitting layer, herein the electron trap material has LUMO level and HOMO level each lower than the LUMO level and HOMO level of the host respectively, and the step of forming the light emitting layer includes a deposition step using deposition sources for a host material, a dopant material and the electron trap material.

In an embodiment of the present invention, the host material, the dopant material, and the electron trap material are deposited at once.

In an embodiment of the present invention, the deposition step can be performed within a chamber, and the host material, the dopant material and the electron trap material are each placed in a deposition material vessel, when they are introduced into the chamber. It is possible that the dopant material and the electron trap material are introduced into the chamber in a mixed state within a single deposition material vessel.

In an embodiment of the present invention, the method further includes at least one of the step of forming a hole injection layer or the step of forming a hole transport layer, after the step of forming the first electrode and before the step of forming the light emitting layer.

In an embodiment of the present invention, the method may further include at least one of the step of forming an electron transport layer or the step of forming an electron injection layer, after the step of forming the light emitting layer and before the step of forming the second electrode.

In an embodiment of the present invention, the electron trap material has the LUMO level and HOMO level each lower than the LUMO level and HOMO level of the host by 0.1~0.5 eV respectively. In another embodiment of the present invention, the electron trap material has the LUMO level and HOMO level each lower than the LUMO level and HOMO level of the host by 0.1~0.3 eV, respectively.

In an embodiment of the present invention, there is provided an organic light emitting device including: a substrate; a first electrode formed on the substrate; a hole layer formed on the first electrode; a light emitting layer formed on the hole layer, which includes an organic light emitting material and an electron trap material; an electron layer formed on the light emitting layer; and a second electrode formed on the electron layer, wherein the electron trap material has LUMO level and HOMO level each lower than the LUMO level and HOMO level of the organic light emitting material respectively.

In an embodiment of the present invention, the hole layer includes at least one of a hole injection layer or a hole transport layer. In another embodiment of the present invention, the electron layer includes at least one of an electron transport layer or an electron injection layer.

In an embodiment of the present invention, the electron trap material has the LUMO level and HOMO level each lower than the LUMO level and HOMO level of the organic light emitting material by 0.1~0.5 eV, respectively.

In an embodiment of the present invention, the electron trap material has an emission wavelength shorter than that of the organic light emitting material.

According to an embodiment of the present invention, the introduction of an electron trap material into a light emitting layer can improve light emitting efficiency of an organic light emitting device and increase the life span.

In the organic light emitting device of an embodiment of the present invention, the light emitting layer includes an electron trap material, which allows electrons to easily stay within the light emitting layer and allows the electrons to be uniformly distributed within the light emitting layer, while preventing the electrons from concentrating on the interface between the hole transport layer (HTL) and the light emitting layer (EML) (HTL/EML interface). This improves the light emitting efficiency, and also prolongs the life span by inhibiting damage to a specific region of the device. Also, in an embodiment of the present invention, the luminous efficiency can be improved by doping an electron trap material in a relatively small amount into the light emitting layer (EML). Thus, there is an advantage in that a conventional process and a conventional apparatus can be employed in the manufacturing of the organic light emitting device.

The structure according to an embodiment of the present invention is different from a structure where an additional electron blocking layer (EBL) is formed between a light emitting layer (EML) and a hole transport layer (HTL). In the structure of the EBL, light emission occurs mainly in the interface between the light emitting layer and the hole transport layer by blocking electrons from crossing into the hole transport layer (HTL) from the light emitting layer. Also, when the electron blocking layer (EBL) is introduced, a further process and a further apparatus in order for forming an additional layer EBL, are required. On the other hand, in the embodiment of the present invention, there is an advantage in that a conventional process and a conventional apparatus can be employed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, embodiments of the present invention will be described with reference to the accompanying drawings. However, the scope of the present invention is not limited to the embodiment or the drawings.

In the following description and drawings, features and shapes depicted in the drawings have been simplified or enlarged to facilitate explanation and understanding. Also, the same reference numerals are used to designate the same or similar components.

Also, it should be understood that in this description when a layer or an element is referred to as being "on" another layer or element, this layer or element can be directly on the other layer or element, or an intervening layer may also be present.

Figure 3:
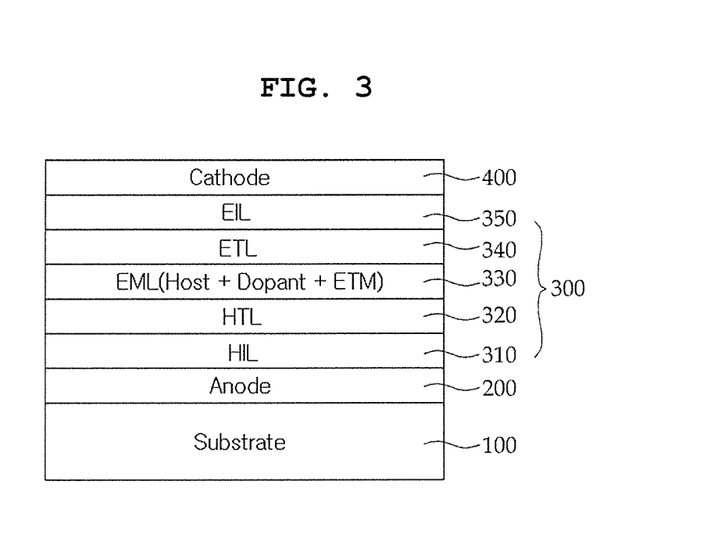
FIG. 3 is a schematic view illustrating the structure of an organic light emitting device according to one embodiment of the present invention.
Figure 4:
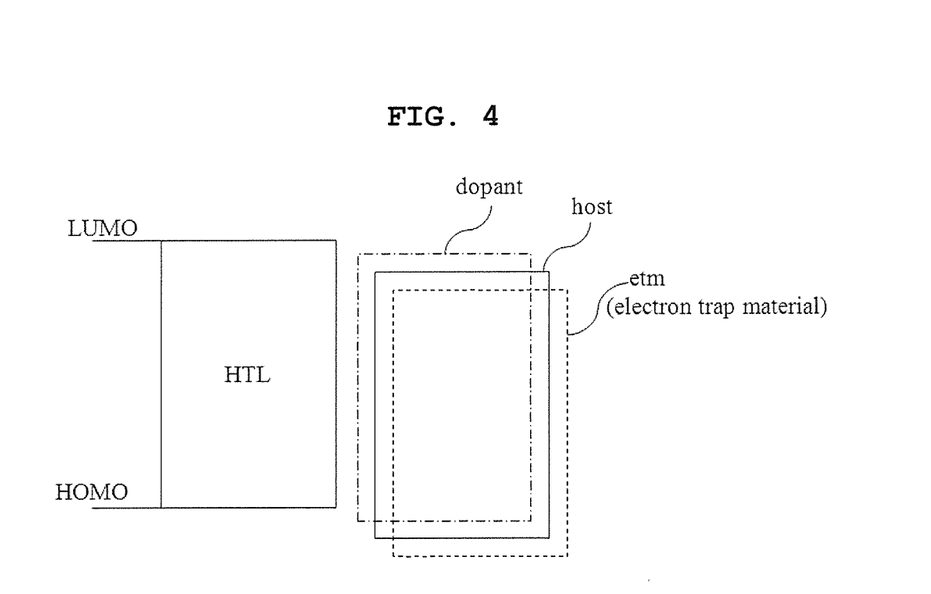
FIG. 4 is a schematic view illustrating an LUMO (Lowest Unoccupied Molecular Orbital) level and a HOMO (Highest Occupied Molecular Orbital) level of a host, a dopant, and an electron trap material in an organic light emitting device according to one embodiment of the present invention.

FIG. 3 is a schematic view illustrating an organic light emitting device according to one embodiment of the present invention.

The organic light emitting device includes a substrate 100, a first electrode 200 formed on the substrate, a second electrode 400, and an organic layer 300 intervened between the first electrode 200 and the second electrode 400. In the organic layer 300, a light emitting layer (EML) 330, that is, an organic light emitting layer, is disposed.

In the organic light emitting device exemplified in FIG. 3, between the first electrode 200 and the organic light emitting layer 330, a hole injection layer (HIL) 310 and a hole transport layer (HTL) 320 are formed. It is possible that only the hole injection layer or the hole transport layer is formed.

Also, as shown in FIG. 3, between the organic light emitting layer 330 and the second electrode 400, an electron transport layer (ETL) 340 and an electron injection layer (EIL) are formed. It is also possible that only the electron transport layer or the electron injection layer is formed.

Specifically, the substrate 100 may be selected from those generally used in an organic light emitting device. As the substrate, a glass substrate or a transparent plastic substrate, which is excellent in mechanical strength, thermal stability, transparency, surface smoothness, handlability and waterproofing property, may be used. Although not shown in FIG. 3, between the substrate 100 and the first electrode 200, an overcoat layer, an insulating layer, and the like may be further provided as required.

On the substrate 100, the first electrode 200 is formed. The first electrode may be patterned into red, green, and blue sub-pixels (R, G, B sub pixels). In the present embodiment, the first electrode is an anode.

The first electrode 200 may be a transparent electrode, a semitransparent electrode or a reflective electrode. For example, it may be made of indium-tin oxide (ITO), indium zinc oxide (IZO), tin oxide ($SnO_2$), zinc oxide (ZnO), or the like. Also, it may have various modifications such as a structure of two or more layers including two or more different materials. The material and the structure for the first electrode are not limited thereto.

The hole injection layer (HIL) 310 is one of organic layers, and may be formed by vacuum thermal deposition, spin coating, or the like. A material for forming the hole injection layer may be selected from those generally known as hole injection materials. For example, it may be selected from the group including phthalocyanine compounds (such as copper phthalocyanine), starburst-type amine derivatives such as TCTA, m-MTDATA, and m-MTDAPB, soluble conductive polymers such as Pani/DBSA (Polyaniline/Dodecylbenzenesulfonic acid), PEDOT/PSS (Poly(3,4-ethylenedioxythiophene)/Poly(4-styrenesulfonate)), Pani/CSA (Polyaniline/Camphor sulfonic acid) or PANI/PSS (Polyaniline/Poly(4-styrene-sulfonate). However, the hole injection material is not limited thereto.

From among the hole injection materials, the TCTA and the m-MTDATA are represented by Formulas 2 and 3 below.

Formula 2

-continued

Formula 3

On the hole injection layer (HIL) 310, the hole transport layer (HTL) 320 is disposed. The hole transport layer is one of the organic layers, and may be formed by various suitable methods such as vacuum deposition, spin coating, a casting method or an LB method. For example, vacuum deposition may be employed because it has an advantage in that a uniform layer can be easily obtained, and pin holes seldom occur. When the vacuum deposition is used to form the hole transport layer 320, the deposition condition and the coating condition may vary according to the compound to be used. However, in general, such conditions may be selected in almost the same condition ranges as those in the formation of the hole injection layer.

There is no specific limitation in the material for forming the hole transport layer 320. As the material, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like may be used.

In the inventive organic light emitting device, the organic light emitting layer 330 includes a host, a dopant, and an electron trap material.

In the present invention, the light emitting layer has a mechanism in which a host and a light emitting dopant form the light emitting matter. Here, as a material for the host, a fluorescent host or a phosphorescent host may be used.

Examples of a material for the fluorescent host may include tris(8-hydroxy-quinolinato)aluminum (Alq3), 9,10-di(naphthyl-2-yl)anthracene (AND), 3-Tert-butyl-9,10-di(naphthyl-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl(p-DMDPVBi), Tert(9,9-diarylfluorene)s (TDAF), 2-(9,9'-spirobifluoren-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 2-methyl-9,10-di-(2-naphthyl)anthracene(2-methyl-9,10-di-(2-naphthyl) anthracene) (MADN), and the like.

Also, examples of a material for the phosphorescent host may include 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), and the like.

Especially, in an embodiment of the present invention, it is possible to significantly improve the life span of a device by introducing an electron trap material into a light emitting layer including a fluorescent host material.

As the dopant, a material used as a light emitting material of an organic light emitting device may be used. There is no specific limitation in the dopant material as long as it can show a light emitting property. Such a dopant light emitting material may be divided into a red light emitting material, a green light emitting material, and a blue light emitting material.

Examples of the red light emitting dopant material may include Tetraphenylnaphthacene (Rubrene), tris(1-phenylisoquinoline)iridium(III) (Ir(piq)$_3$), bis(2-benzo[b]thiophene-2-yl-pyridine) (acetylacetonate)iridium (III) (Ir(btp)$_2$(acac)), tris(dibenzoylmethane)phenanthroline europium (III) (Eu(dbm)$_3$(phen)), tris[4,4'-di-tert-butyl-(2,2')-bipyridine]ruthenium(III)complex(Ru(dtb-bpy)$_3$*2 (PF$_6$)), DCM1, DCM2, Eu (thenoyltrfluoroacetone)$_3$ (Eu (TTA)$_3$), butyl-6-(1,1,7,7-tetramethyl julolydyl-9-enyl)-4H-pyran) (DCJTB) and the like.

Also, examples of the green light emitting dopant material may include 3-(2-benzothiazolyl)-7-(diethylamino)coumarin (Coumarin 6), 2,3,6,7-tetrahydro-1,1,7,7-tetramethyl-1H,5H,11H-10-(2-benzothiazolyl)quinolizino-[9,9a,1gh] coumarin (C545T), N,N'-dimethyl-quinacridone (DMQA), tris(2-phenylpyridine)iridium(III) (Ir(ppy)$_3$), and the like.

Also, examples of the blue light emitting dopant material may include oxadiazole dimer dyes (Bis-DAPDXP), spiro compounds (Spiro-DPVBi, Spiro-6P), triarylamine compounds, (bis(styryl)amine)(DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino) styryl]stilbene (DPAVB), 4,4'-bis[4-(diphenylamino)styryl]biphenyl (BDAVBi), bis(3,5-difluoro-2-(2-pyridyl)phenyl-(2-carboxypyridyl)iridiumIII (FIrPic), DPVBi and the like.

Besides the above mentioned materials, phenylene-based, phenylene vinylene-based, thiophene-based, fluorene-based, and spiro-fluorene-based polymers and nitrogen-containing aromatic compounds may be used as a light emitting dopant material. However, the light emitting dopant material is not limited thereto.

In one embodiment, as the dopant material, a material having a high compatibility with a host material is selected.

Specially, as the dopant, a material having LUMO level and HOMO level higher than the LUMO level and HOMO level of the host may be used. For example, as the dopant material, a material having LUMO level and HOMO level each higher than the LUMO level and HOMO level of the host by 0.1~0.5 eV may be selected.

In the light emitting layer of an embodiment of the present invention, besides the host and the dopant, an electron trap material is used.

In one embodiment, the electron trap material has LUMO level and HOMO level each lower than the LUMO level and HOMO level of the host respectively. Specifically, as the electron trap material, a material having LUMO level and HOMO level each lower than the LUMO level and HOMO level of the host by 0.1~0.5 eV is used. Also, in one embodiment, a material having LUMO level and HOMO level each lower than the LUMO level and HOMO level of the host by 0.1~0.3 eV is used as the electron trap material.

As described above, when having LUMO level and HOMO level each lower than the LUMO level and HOMO level of the host by 0.1 eV or more, the electron trap material can efficiently perform a role as an electron trap.

In the present invention, as the electron trap material, a material having an excited state level, that is, a LUMO (Lowest Unoccupied Molecular Orbital) level, lower than that of the host is used. In other words, in the present invention, the above described electron trap material is introduced into the light emitting layer of the organic light emitting device so that the electron trap material can trap excess electrons that have flowed into the light emitting layer.

Specifically, the electron trap material prevents excess electrons that have flowed into the light emitting layer from moving to the hole injection layer, thereby inhibiting deterioration of the life span of the organic light emitting device. When the electron trap material introduced into the light emitting layer performs a role as an electron trap as described above, it is possible to prolong the life span of light emitting pixel parts of the organic light emitting device.

In one embodiment, when a difference between the electron trap material and the host in a LUMO level and an HOMO level is each less than 0.1 eV, the role of the electron trap material as an electron trap is insignificant. On the other hand and in another embodiment, when the difference is greater than 0.5 eV, an electron trap excessively occurs, thereby inhibiting light emission. Accordingly, LUMO levels and HOMO levels of the electron trap material and the host are adjusted as described above.

When the electron trap material is used, especially, it is effective in the prolongation of the life span of a blue pixel. In some cases, in order to prolong the life span of a blue pixel, two dopants have been used in a comparative method. However, this comparative method has a disadvantage in that the efficiency is lowered. Also, in an embodiment of the present invention, when the electron trap material is introduced into the light emitting layer, the operating characteristic and the efficiency can be maintained at the same or higher level than those of a comparative device, and the life span can be increased by 2~3 times or more than that of the comparative device.

As such, an electron trap material, the compound represented by Formula 1 below, may be used.

Formula 1

In Formula 1, X represents an aromatic hydrocarbon. Specifically, X may include at least one selected from the group including benzene, naphthalene, anthracene, pyrene, perylene, triphenylene, penanthrene, chrysene, fluorene and spirofluorene.

$R_1$, $R_2$, $R_3$, $R_4$, $R_5$, and $R_6$ each represent any one of H, [EW], R or R-[EW].

Herein, H represents hydrogen, and all of $R_1$ to $R_6$ can not be hydrogen (H).

[EW] represents an electron withdrawing group. Specifically, [EW] may be selected from the group including pyridine, pyrimidine, triazine, cyano group, triazole, triazine, oxazine, oxazole, oxadiazole, oxadiazine and halogen. Herein, the halogen includes chlorine (Cl), fluorine (F), bromine (Br) and iodine (I).

R represents an aromatic compound. Specifically, R may be selected from the group including an aromatic ring of C5~C40, an arylamine of C5~C40, a heteroaromatic group of C4~C40, and carbazole. In one embodiment of the present invention, R may be selected from the group including an aromatic ring of C5~C20, an arylamine of C5~C20, a heteroaromatic group of C4~C20, and carbazole.

R-[EW] represents an aromatic compound (R) substituted with an electron withdrawing group (EW). Herein, R and [EW] are the same as described above.

The electron trap material represented by Formula 1 specifically includes the compound represented by Formulas 4 to 13 below.

Formula 4

Formula 5

Formula 6

Formula 7

-continued

Formula 8

Formula 9

Formula 10

Formula 11

Formula 12

Formula 13

Specifically, examples of the electron trap material may include materials represented by Formulas 14 to 38 below.

Formula 14

Formula 15

Formula 16

Formula 17

Formula 18

Formula 19

Formula 20

Formula 21

Formula 22

Formula 23

Formula 24

Formula 25

Formula 26

Formula 27

Formula 28

-continued

Formula 29

Formula 30

Formula 31

Formula 32

Formula 33

Formula 34

-continued

Formula 35

Formula 36

Formula 37

-continued

Formula 38

The electron trap material is not limited to the materials represented by Formulas above.

HOMO levels, LUMO levels, and singlet emission wavelengths of electron trap materials represented by Formulas 14 to 18 are noted in table 1 below.

TABLE 1

| Index | HOMO (eV) | LUMO (eV) | Singlet wavelength (nm) |
|---|---|---|---|
| Formula 14 | −5.51 | −2.19 | 416 |
| Formula 15 | −5.32 | −2.06 | 437 |
| Formula 16 | −5.29 | −1.93 | 412 |
| Formula 17 | −5.21 | −2.07 | 448 |
| Formula 18 | −5.37 | −2.15 | 429 |
| Host | −5.10 | −1.65 | 398 |

Although in table 1, HOMO levels, LUMO levels, and singlet emission wavelengths of electron trap materials represented by Formulas 14 to 18 are noted, it is possible to obtain HOMO levels, LUMO levels and singlet emission wavelengths of other electron trap materials.

Furthermore, it is possible to obtain HOMO levels, LUMO levels and singlet emission wavelengths of a host material and a dopant.

As described above, it is possible to obtain an HOMO level, a LUMO level, and the like of each material. Thus, as required, a person skilled in the art can select an appropriate host material and an appropriate dopant. The person skilled in the art can then select an electron trap material, which has LUMO level and HOMO level lower than the LUMO level and HOMO level of the host material by a set or predetermined value. On the other hand, when an electron trap material is firstly selected, it is possible to select a host material having LUMO level and HOMO level higher than the LUMO level and HOMO level of the electron trap material by a set or predetermined value.

For example, as required, the person skilled in the art can easily select and combine a host material and an electron trap material in such a manner that the electron trap material can have LUMO level and HOMO level each lower than the LUMO level and HOMO level of the host material, by 0.1~0.5 eV respectively.

The light emitting layer 330 may further include another material for adjusting the LUMO level and HOMO level of the electron trap material. For example, it may further include an alkali metal in the light emitting layer.

The organic light emitting layer may include a dopant in an amount of 1~25 parts by weight, and an electron trap material in an amount of 1~50 parts by weight, with respect to 100 parts by weight of the host.

Also, the dopant and the electron trap material may be included in a weight ratio of 1:1~2 (dopant:electron trap material). As described above, when the electron trap material is included in an amount one or two times as much as the dopant, it is possible to obtain a high electron trap effect. This improves a device's life span.

Also, in one embodiment, when the dopant is included in a very small amount, the light emitting efficiency is lowered. On the other hand and in another embodiment, when the dopant is included in a very large amount, the device's life span prolonging effect caused by an electron trap is insignificant. Accordingly, the contents of the host, the dopant, and the electron trap material have to be adjusted as described above.

As required, the contents of the host, the dopant, and the electron trap material may be adjusted.

Also, in one embodiment, the electron trap material has no negative effect on light emission of the light emitting layer. When the electron trap material has an effect on light emission of the light emitting layer, a color coordinate may be changed. This may make it difficult to achieve required color on the whole. Accordingly, the dopant and the electron trap material are selected in such a manner that the electron trap material has an emission wavelength shorter than that of the dopant. In other words, when the dopant and the electron trap material are selected, the electron trap material having an emission wavelength shorter than that of the dopant is selected. As described above, when the emission wavelength of the electron trap material is shorter than that of the dopant, the electron trap material has no effect on light emission of the light emitting layer.

The light emitting layer may be formed by vacuum deposition, spin coating, a casting method, an LB, and the like.

In the present embodiment, the organic light emitting layer is formed by co-deposition of the host material, the dopant material and the electron trap material. For this reason, the forming process of the light emitting layer is very simplified, which makes it easy to manufacture the light emitting layer. As a result, the manufacturing process of an organic light emitting device is also simplified, which makes it easy to manufacture the device.

The structure according to the present invention, where the electron trap material is introduced into the light emitting layer, is different from a structure where an additional electron blocking layer (EBL) is formed between a light emitting layer and an anode or a cathode. For example, in the structure where an electron blocking layer is formed between the light emitting layer and the hole transport layer, it is possible to block electrons from crossing into the hole transport layer (HTL) at a main light emitting interface, that is, an interface between the hole transport layer (HTL) and the light emitting layer (EML). This is advantageous in the formation of excitons within the light emitting layer, and improves the light emitting efficiency. Here, in one embodiment of the present invention, the electron trap material allows the electrons to be uniformly distributed within the light emitting layer, while preventing the electrons from concentrating on the interface between the hole transport layer (HTL) and the light emitting layer (EML) (HTL/EML interface). This improves the light emitting efficiency and increases the life span of a device.

When the above described electron blocking layer (EBL) is introduced, a further process and a further apparatus are added to form an additional layer of EBL. On the other hand, in one embodiment of the present invention, the above described effect can be achieved by doping an electron trap material in a relatively small amount into the light emitting layer (EML). Thus, there is an advantage in that a conventional process and a conventional apparatus can be employed in the embodiment of the present invention.

On the light emitting layer 330, the electron transport layer 340 is formed. The electron transport layer may be made of a material having a high capability of transporting injected electrons. As the electron transport layer material, quinoline derivatives, especially commercially available materials such as tris(8-quinolinolate)aluminum (Alq3), TAZ, or Balq may be used. For example, as the electron transport layer material, bis(10-hydroxybenzo[h]quinolinato beryllium) (Bebq2) represented by Formula 39 below, and its derivative may be used. Furthermore, the electron transport layer material may further include metal oxide. Examples of the metal oxide may include oxides of alkali metal, alkaline earth metal, transition metal, and the like.

Formula 39

The electron transport layer material is not limited to the above mentioned materials.

On the electron transport layer 340, an electron injection layer 350 is disposed. The electron injection layer 350 allows electrons to be easily injected from the second electrode 400. In some cases, the electron injection layer 350 may be omitted as required. Such an electron injection layer may be made of LiF, NaCl, CsF, Li$_2$O, BaO, or the like.

The electron transport layer 340 and the electron injection layer 350 may be layered by vacuum deposition, spin coating, or a casting method. The deposition condition may vary according to the compound to be used. However, in general, such a condition may be selected in almost the same condition ranges as that in the formation of the hole injection layer.

Then, on the electron injection layer 350, the second electrode 400 is formed as a cathode. The second electrode may be made of a low work function metal, an alloy, an electrical conductive compound or a mixture thereof. Specifically, the second electrode may be made of lithium (Li), magnesium (Mg), aluminum (Al), aluminum-lithium (Al—Li), calcium (Ca), magnesium-indium (Mg—In), magnesium-silver (Mg—Ag) or the like. Also, in order to manufacture a top-emission device, a transmission material made of ITO, or IZO may be used.

The above described second electrode may be formed by vacuum deposition or a sputtering method.

An aspect of the present invention provides a method for manufacturing the above described organic light emitting device.

The method for manufacturing the organic light emitting device includes the steps of: forming a first electrode on a substrate; forming a light emitting layer including a host, a dopant and an electron trap material on the first electrode, and forming a second electrode on the light emitting layer.

In the step of forming the light emitting layer, a host material, a dopant material, and an electron trap material may be subjected to deposition.

The deposition step may be performed within a chamber. The host material, the dopant material and the electron trap material are each placed in a deposition material vessel, while being introduced into the chamber. In the deposition step in the present embodiment, the host material, the dopant material and the electron trap material are deposited at once (concurrently or simultaneously deposited). In other words, co-deposition is performed.

As described above, since the co-deposition can be performed, the step of forming the light emitting layer is very simplified in the organic light emitting device manufacturing process. This makes it easy to manufacture the light emitting layer. As a result, the process of manufacturing the organic light emitting device becomes also simplified and easy.

Especially, when the dopant material and the electron trap material have similar deposition temperatures, the dopant material and the electron trap material are introduced into the chamber in a mixed state within a single common vessel. Thus, it is possible to deposit the dopant and the electron trap material by using only one vessel. As a result, the deposition apparatus may be more simplified, and the deposition may be more easily performed. Also, in order to use the common vessel as described above, it is required to select a dopant material and an electron trap material having similar deposition temperatures.

Also, in order to further form at least one of the hole injection layer or the hole transport layer, at least one of a step of forming a hole injection layer or a step of forming a hole transport layer may be further carried out after the step of forming the first electrode and before the step of forming the light emitting layer.

Also, in order to further form at least one of the electron transport layer or the electron injection layer, at least one of a step of forming an electron transport layer or a step of forming an electron injection layer may be further carried out after the step of forming the light emitting layer and before the step of forming the second electrode.

As the electron trap material, a material having LUMO level and HOMO level each lower than the LUMO level and HOMO level of the host is selected. Specifically, as the electron trap material, a material having LUMO level and HOMO level each lower than the LUMO level and HOMO level of the host by 0.1~0.5 eV may be selected. According to another embodiment, as the electron trap material, a material having LUMO level and HOMO level each lower than the LUMO level and HOMO level of the host by 0.1~0.3 eV may be selected.

Also, the present invention provides an organic light emitting device, which includes a substrate 100; a first electrode 200 formed on the substrate, a hole layer (HIL and HTL) 310 and 320 formed on the first electrode; a light emitting layer 330 formed on the hole layer, which includes an organic light emitting material, and an electron trap material; an electron layer (EIL and ETL) 340 and 350 formed on the light emitting layer; and a second electrode 400 formed on the electron layer, wherein the electron trap material has LUMO level and HOMO level each lower than the LUMO level and HOMO level of the organic light emitting material.

According to an embodiment of the present invention, the hole layer may include at least one of a hole injection layer 310 or a hole transport layer 320. Also, the electron layer may include at least one of an electron transport layer 340 or an electron injection layer 350. According to an embodiment of the present invention, the electron trap material has LUMO level and HOMO level each lower than the LUMO level and HOMO level of the organic light emitting material by 0.1~0.5 eV. According to an embodiment of the present invention, the electron trap material has an emission wavelength shorter than that of the organic light emitting material.

Example

Manufacture of an Organic Light Emitting Device

An organic light emitting device having the structure as described below was manufactured.

As a first electrode (that is, an anode) and a substrate, an ITO glass substrate (Corning) with 15 Ω/cm$^2$ (1200 Å) was cut into a size of 50 mm×50 mm×0.7 mm, ultrasonic-cleaned in isopropyl alcohol and in pure water for 5 minutes, subjected to ultraviolet irradiation for 30 minutes, and cleaned through exposition to ozone ($O_3$). Then, the resultant glass substrate was mounted in a vacuum deposition apparatus.

On the glass substrate, m-MTDATA as a hole injection layer was formed with a thickness of 500 Å through vacuum deposition. Then, NPD as a hole transport layer was formed with a thickness of 200 Å on the hole injection layer through vacuum deposition.

Then, a light emitting layer was formed with a thickness of 400 Å by using 2-methyl-9,10-di-(2-naphthyl)anthracene (MADN) as a fluorescent host, DPVBi as a dopant, and a material represented by Formula 15 as an electron trap material. Herein, the dopant was used in an amount of 2 parts by weight, and the electron trap material was used in an amount of 4 parts by weight with respect to 100 parts by weight of the host.

Then, Alq3 as an electron transport layer was deposited with a thickness of 300 Å, and on the electron transport layer, LiF as an electron injection layer was deposited with a thickness of 5 Å. Next, Al as a second electrode (that is, a cathode) was vacuum-deposited with a thickness of 1000 Å, thereby providing an organic light emitting device.

Comparative Example

Manufacture of an Organic Light Emitting Device

An organic light emitting device was manufactured in the same manner as described in the Example except that the compound represented by Formula 15 as an electron trap material was not used in the formation of a light emitting layer. This was used as the Comparative Example.

Test Example

Test on a Life Span Characteristic

Figure 5:
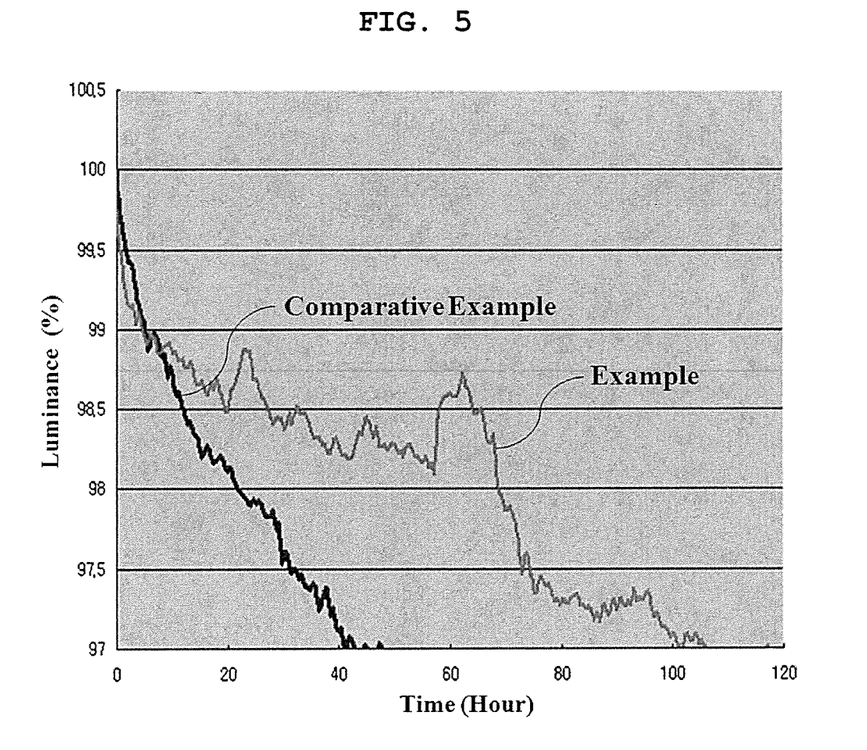
FIG. 5 shows a graph of light emitting life spans measured from an organic light emitting device according to one embodiment of the present invention, and a conventional organic light emitting device according to Comparative Example.

On the devices from the Example and the Comparative Example, luminance was measured by using PR650 (Spectroscan spectrometer, PHOTO RESEARCH INC.) with the lapse of time. The results are shown in FIG. 5. FIG. 5 shows the luminance with the lapse of time, that is, a luminance ratio with the lapse of time with respect to 100% of initial luminance of an organic light emitting device.

Referring to FIG. 5, when a luminance reliability standard for product application is 97%, the organic light emitting device from the Example has a life span of about 110 hours while the organic light emitting device from the Comparative Example has a life span of about 45 hours. Accordingly, it can be found that the inventive organic light emitting device has a high life span characteristic.

Although embodiments of the present invention have been described for illustrative purposes, those skilled in the art will appreciate that various modifications, additions and substitutions are possible, without departing from the scope and spirit of the invention as disclosed in the accompanying claims, and equivalents thereof.

What is claimed is:

1. An organic light emitting device comprising:
   a substrate;
   a first electrode on the substrate;
   an organic light emitting layer on the first electrode; and
   a second electrode on the organic light emitting layer,
   wherein the organic light emitting layer comprises a host, a dopant and an electron trap material,
   the dopant has LUMO (Lowest Unoccupied Molecular Orbital) level and HOMO (Highest Occupied Molecular Orbital) level each higher than LUMO level and HOMO level of the host, respectively, and
   the electron trap material has LUMO level and HOMO level each lower than LUMO level and HOMO level of the host, respectively, and
   the electron trap material is represented by Formula 1 below:

[Formula 1]

wherein:
   X represents an aromatic hydrocarbon selected from benzene, naphthalene, anthracene, pyrene, perylene, triphenylene, phenanthrene, chrysene, fluorene and spirofluorene, and $R_1$, $R_2$, $R_3$, $R_4$, $R_5$ and $R_6$ each represent H, [EW], R or R-[EW], wherein:
   H represents hydrogen,
   [EW] represents an electron withdrawing group, and
   R represents an aromatic compound, wherein:
   all of $R_1$ to $R_6$ are not hydrogen (H).

2. The organic light emitting device as claimed in claim 1, wherein at least one of a hole injection layer or a hole transport layer is disposed between the first electrode and the organic light emitting layer.

3. The organic light emitting device as claimed in claim 1, wherein at least one of an electron transport layer or an electron injection layer is disposed between the organic light emitting layer and the second electrode.

4. The organic light emitting device as claimed in claim 1, wherein the host is a fluorescent host.

5. The organic light emitting device as claimed in claim 1, wherein the electron trap material has the LUMO level and HOMO level each lower than the LUMO level and HOMO level of the host by 0.1~0.5 eV, respectively.

6. The organic light emitting device as claimed in claim 1, wherein the electron trap material has the LUMO level and HOMO level each lower than the LUMO level and HOMO level of the host by 0.1~0.3 eV, respectively.

7. The organic light emitting device as claimed in claim 1, wherein the organic light emitting layer comprises the dopant in an amount of 1~25 parts by weight, and the electron trap material in an amount of 1~50 parts by weight, with respect to 100 parts by weight of the host.

8. The organic light emitting device as claimed in claim 1, wherein the dopant and the electron trap material are included in a weight ratio of 1:1~2 (dopant:electron trap material).

9. The organic light emitting device as claimed in claim 1, wherein the electron trap material has an emission wavelength shorter than that of the dopant.

10. The organic light emitting device as claimed in claim 1, wherein the organic light emitting layer is formed by co-deposition of a host material, a dopant material and the electron trap material.

11. The organic light emitting device as claimed in claim 1, wherein the dopant has LUMO level and HOMO level each higher than the LUMO level and HOMO level of the host by 0.1~0.5 eV, respectively.

* * * * *